May 15, 1962 R. R. WEBSTER 3,035,170

AUTOMATIC GAIN CONTROLS FOR RADIOS

Filed May 15, 1956 3 Sheets-Sheet 1

INVENTOR

Roger R. Webster

BY Stevens, Davis, Miller & Mosher

ATTORNEYS

AUTOMATIC GAIN CONTROLS FOR RADIOS

Filed May 15, 1956 3 Sheets-Sheet 2

INVENTOR
Roger R. Webster

BY Stevens, Davis, Miller and Mosher
ATTORNEYS

INVENTOR
Roger R. Webster
BY Stevens, Davis, Miller and Mosher
ATTORNEYS 3,035,170

AUTOMATIC GAIN CONTROLS FOR RADIOS

Roger R. Webster, Dallas, Tex., assignor to Texas Instruments Incorporated, Dallas, Tex., a corporation of Delaware Filed May 15, 1956, Ser. No. 585,098
5 Claims. (Cl. 250—20)

This invention relates to electrical amplifier circuits, and more particularly to electrical amplifying circuits using semiconductor devices and suitable for use in radio receivers.

While semiconductor devices can be made to function to a certain extent like vacuum tubes, the analogy between the two is in no sense complete, and many difficulties are encountered in adapting vacuum tube circuits to operate with transistors. In most cases, in fact, complete redesign of the circuit becomes inevitable.

One particular difficulty, that has been encountered in the use of semiconductor devices to perform functions previously performed by vacuum tubes, has occurred in the previous attempts to design amplifier circuits using transistors and capable of amplifying incoming signals having a wide range of amplitudes.

In an n-p-n transistor, for example, it is common to introduce the signal to be amplified to the emitter of the transistor and to bias this emitter for normal amplification to a potential of 0.1 to 0.2 volt negative with respect to the potential of the base. When the amplitude of the incoming signals begins to reach this order of magnitude, serious distortion results both in the input stage of the amplifier and in the stages that follow. Automatic volume control may be applied to the input stage to reduce the bias between the emitter and the base, and thus reduce the amplification of the input stage and avoid overloading the following stages, but this causes clipping and more serious distortion in the input stage.

An object of this invention, therefore, is to provide a means for preventing overloading and distortion, not only in the subsequent stages of an amplifier, but also in the initial stage, and at the same time to minimize distortion as a result of so doing.

The principles of this invention may be utilized to prevent the overloading of either the first or any subsequent stage of an amplifier, and the amplifier may be either a vacuum tube or a semiconductor amplifier, but the particular value and importance of this invention lies in protecting the first stage of a semiconductor amplifier from overloading without at the same time introducing serious distortion. In this connection, it should be pointed out that the second or subsequent stages of the amplifier may be either transistor stages or vacuum tube stages, and in either case the principles of this invention will be useful. However, again, because of the particular nature of semiconductor amplifiers, the principles of this invention are especially useful where the subsequent stages of amplification are of the semiconductor type.

Basically, the present invention consists in shunting the input tank circuit that feeds the first amplifier stage, with a semiconductor diode. This is done in such a way that the semiconductor diode acts as a non-linear resistance to attenuate excess signal amplitude. In accordance with this invention, it has been found possible to attenuate the excess amplitude of high level input signals without appreciably affecting low level operation and without causing serious distortion.

Either point contact or junction diodes may be utilized for this purpose, and they may be of germanium or silicon or other semiconductor material. Some special advantages are obtained by the use of silicon diodes, since they have less curvature of the resistance characteristic near the origin, but ultimately exercise greater control by changing resistance faster for a given change in voltage at higher levels.

The portion of the high level signals passing through the semiconductor diode may by appropriate circuit arrangements be utilized to change the emitter-base bias on the first transistor, and thus further control the volume of the signal as it is amplified.

In addition to providing means for preventing the overloading of an amplifier stage, this invention provides a complete radio receiving circuit embodying the principles of this invention and employing only semiconductor devices and no vacuum tubes. While the principles of this invention are applicable to circuits that do employ vacuum tubes, they are particularly applicable to radio receiving circuits that employ only semiconductor devices.

Further details and advantages of this invention will be apparent from a consideration of the appended drawings, which illustrate several preferred embodiments thereof, and the following detailed description of these embodiments. These embodiments are intended to be illustrative and not limiting, and the many modifications that will immediately be apparent to those skilled in the art are to be considered as falling within the scope of this invention and the appended claims. In the drawings:

Figure 1:
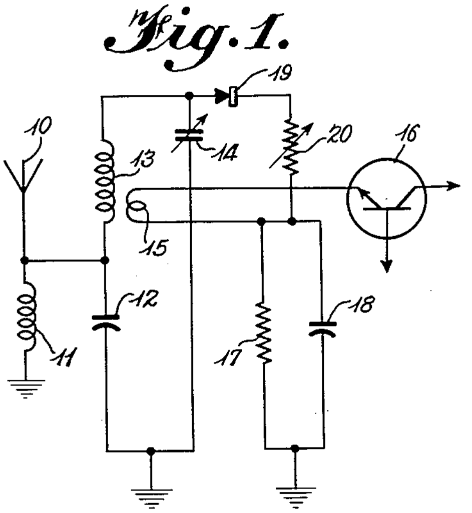
FIGURE 1 is a schematic illustration of one desirable circuit arrangement for the application of the principles of this invention to the first amplifier stage of a radio receiver.

As illustrated in FIGURE 1, an incoming radio signal arrives at an antenna 10 and the several ground connections shown and is applied to a fixed condenser 12 shunted by a radio frequency choke 11 having high impedance at the signal frequency but providing a D.C. path to ground. The condenser 12 forms a part of a resonant circuit, which consists of an inductance 13 and a variable condenser 14, and this circuit is tunable, by operation of the variable condenser, to resonance with any particular radio carrier wave that it is desired to receive. A secondary coil 15 is coupled to the tank circuit inductance coil 13 and serves to take from the tank circuit a signal of reduced voltage and increased current, for application to an n-p-n transistor 16. The secondary coil is connected to the emitter of the transistor and also through a resistor 17 to ground.

The resistor is shunted by a radio-frequency bypass condenser 18 in the usual manner and serves to control the bias between the emitter and the base of the transistor 16. It should be noted in this connection that the normal bias of the emitter with respect to the base of a typical transistor will be about 0.1 to 0.2 volt, with the emitter being negative with respect to the base. This bias is supplied from a source which is not shown. Any increase of this bias would increase the current flow through the transistor, and hence the resistor 17 is so arranged in the circuit that an increase in the flow of current through the resistor tends to reduce the bias.

In accordance with the present invention, it has been found that a semiconductor diode may be connected into such circuit as has just been described, in such a way as to act as a load on the tank circuit, and since the resistance of the diode is non-linear, being quite high for small potentials across it and relatively much lower for higher potentials across it, the diode will serve to load the tank circuit and attenuate high level signals attempting to pass through it, while having very little effect on low level signals passing through the tank circuit.

As illustrated in FIGURE 1, the diode 19 is connected in series with a variable resistance 20 from a point at the ungrounded end of the tank circuit to a point at the ungrounded end of the bias resistor 17 and bypass condenser 18. As a result of this connection, the current that passes through the diode 19 also passes through the bias resistor 17, as well as the variable resistor 20, all of which are connected in series. This provides a shunt path across the tank circuit, thus loading this circuit to an extent dependent upon the effective resistance of this shunt circuit. Since the resistance of the diode 19 varies non-linearly, the effect of the shunt circuit will be much greater at higher signal amplitudes. Germanium diodes begin to be effective at tank circuit voltages of around 0.1 to 0.2 volt and silicon diodes at somewhat higher voltages of around 0.3 to 0.4 volt. The effectiveness of this circuit in controlling the input to the transistor 16 can be varied by varying the resistance of the variable resistor 20, since as this resistance is increased, the shunting effect of the diode circuit will obviously decrease at all input signal levels. The variable resistance 20, therefore, should be set at a point that will give sufficient maximum signal handling capability for the circuit, but at the same time will reduce incidental distortion to a minimum.

The circuit of FIGURE 1 performs an additional function by the passage of the diode circuit current through the bias resistor 17. Since the diode 19 is a rectifier, a direct current component results in the diode circuit, and by properly orienting the diode in the circuit, the direct current component may be caused to act upon the bias resistor 17 so as to decrease the bias between the emitter and the base when large signals are received, thus lowering the amplification of the transistor 16 and protecting subsequent stages of the amplifier from overloading. Since the emitter in an n-p-n transistor is normally negative with respect to the base and it is necessary to reduce this bias in order to reduce the current flow through the transistor, it is necessary that the current flow through the resistor 17 be such as to make the ungrounded end of the resistor more positive with respect to ground as the current flow in the diode circuit increases. Therefore, the diode 19 should be connected into the circuit in such a manner that electron flow is from ground through the diode circuit to the tank circuit.

A small amount of differential distortion of the modulation occurs when the amplitude of the signals is near the point at which the diode begins to conduct. This may be reduced by increasing the resistance of the variable resistor 20, but this increase in resistance also results in the decrease of the maximum signal-handling capability of the circuit. Therefore, depending upon the intensity of the signals that are likely to be encountered, the variable resistor 20 may be adjusted so that the maximum signals to be encountered can be properly handled, and yet the distortion held to a minimum.

The same circuit may be used with a p-n-p type transistor, but in this case the diode should be connected into the circuit in the opposite direction, since the bias between the emitter and the base is opposite for a p-n-p transistor and should be oppositely affected by the diode circuit.

Figure 2:
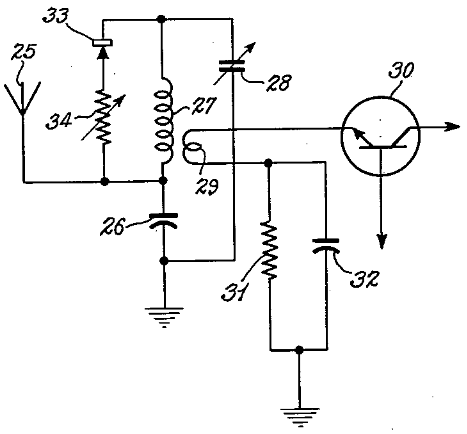
FIGURE 2 is a schematic illustration of a second circuit arrangement for applying the principles of this invention to the first stage of a radio receiver.

In FIGURE 2, a modification of the circuit of FIGURE 1 is illustrated. Here the signal is received by an antenna 25 and impressed across a fixed condenser 26 connected between the antenna and ground. The fixed condenser 26, together with an inductance 27 and a variable condenser 28, forms the tuned tank circuit, and a secondary coil 29 inductively coupled to the coil 27 receives a low voltage, increased current signal and impresses it on the emitter of an n-p-n transistor 30. A bias resistor 31 and a bypass condenser 32 connected in parallel between the other end of the pickup coil 29 and ground serve to control the bias between the emitter and the base.

The overload control in FIGURE 2 consists of a semiconductor diode 33 connected in series with a variable resistance 34 directly across the inductance tank circuit 27. The operation of this circuit is the same as the operation of the circuit of FIGURE 1, except that the current which the semiconductor diode takes from the circuit does not pass through the bias resistor 31, and hence no automatic bias control is accomplished.

Figure 3:
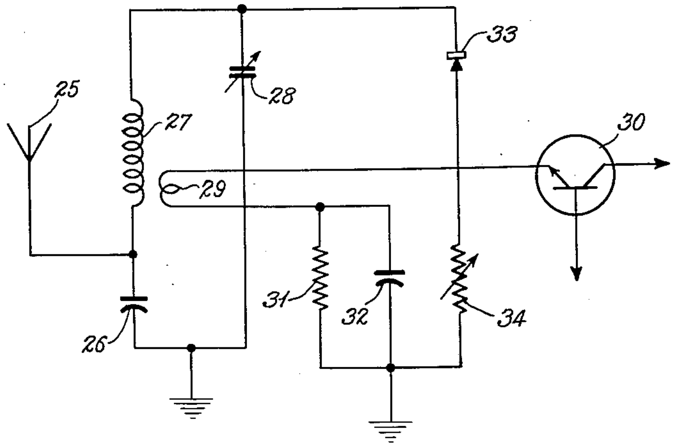
FIGURE 3 is a schematic illustration of still another circuit applying the principles of this invention to the first stage of a radio receiver.

The same circuit is shown in FIGURE 3 as is shown in FIGURE 2, with the exception of the fact that the semiconductor diode 33 and the variable resistance 34 are connected in series between the ungrounded side of the variable condenser 28 and ground, instead of being connected across the inductance coil 27. This results in a circuit in which there is no direct current return for the current flowing through the diode 33. As a consequence of this difference, the results of using this circuit with a point contact diode have not been satisfactory. However, if a junction type diode is used in this type of circuit, there is sufficient carrier storage of electrons and holes, so that the circuit works quite satisfactorily. The circuits of FIGURES 1, 2 and 3 have all been shown as applied to n-p-n transistors, but they can, of course, be applied to p-n-p transistors as well. The use of the circuits of FIGURES 1, 2 and 3 and other similar circuits makes possible an increase of 20 to 40 decibels in the input signal range that can be handled without overloading the first and subsequent stages of a transistorized radio receiver. This is particularly important in mobile receivers. By proper adjustment of automatic volume control circuit values, it is possible to greatly reduce distortion while enormously extending the operating range. Signals of an amplitude of 500,000 microvolts with 80 percent modulation can be handled with very little distortion.

Figure 4:
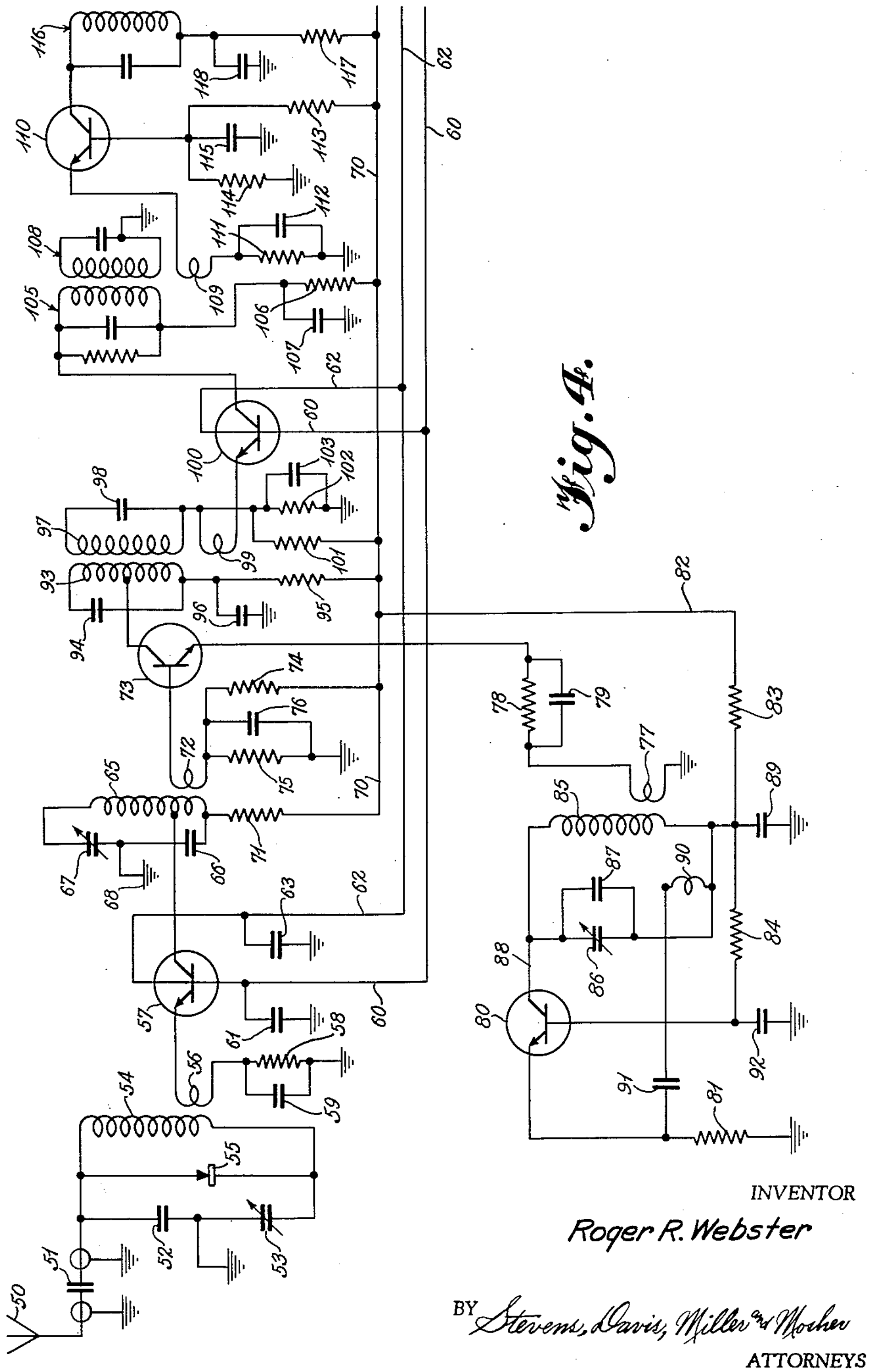
FIGURE 4 is a schematic illustration of the first part of an all-transistor radio receiver circuit employing the principles of this invention.
Figure 5:
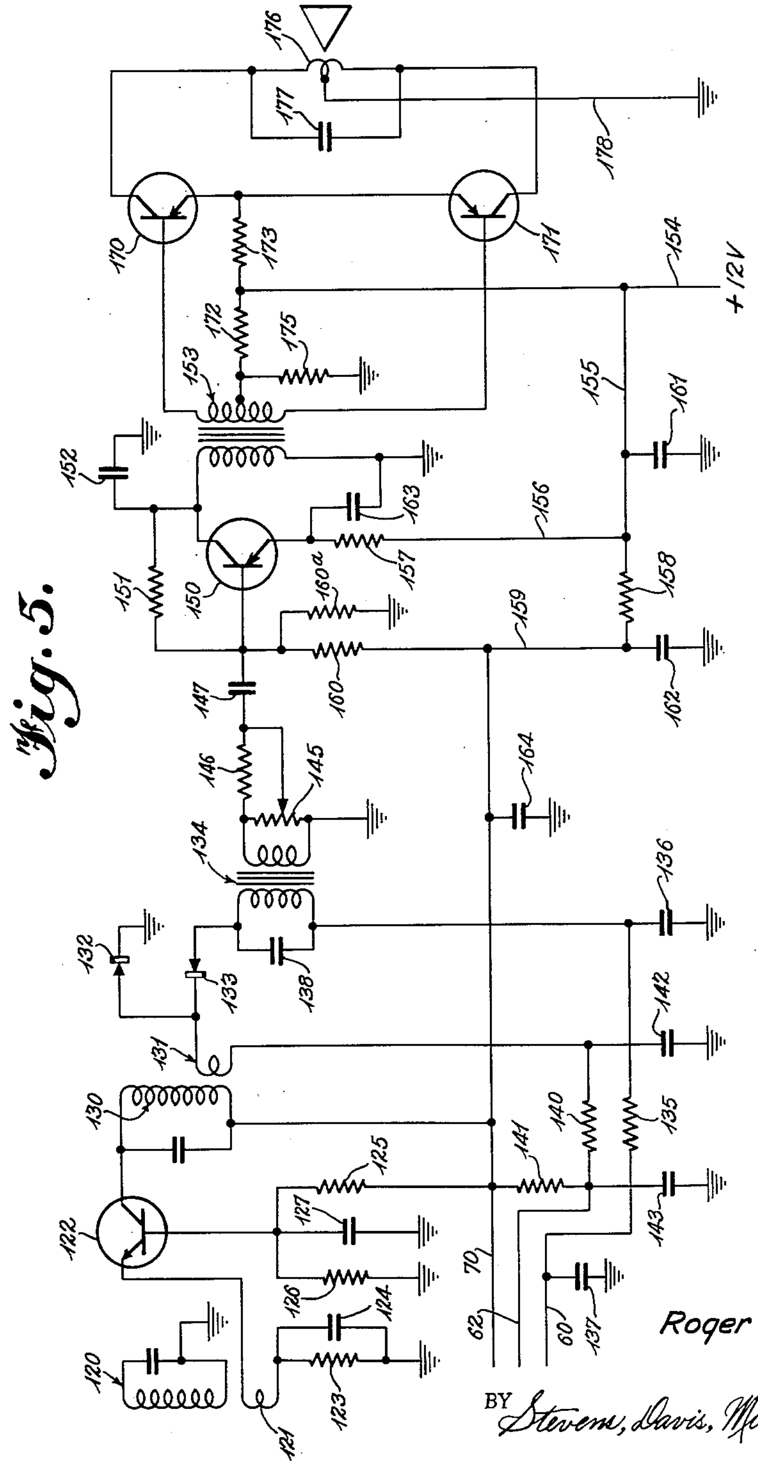
FIGURE 5 is a schematic illustration of the remainder of the same radio circuit.

To further illustrate the principles of this invention and also to show it in its most advantageous embodiment, a complete schematic diagram of a radio receiver operating on the superheterodyne principle and utilizing only transistors and semiconductor diodes, and no vacuum tubes, is illustrated in FIGURES 4 and 5, which, taken together, comprise one circuit.

Starting with FIGURE 4, an incoming radio signal from an antenna 50 passes through a shielded lead-in to a D.C. isolating condenser 51 and then through another shielded lead-in to a tank circuit, where it is impressed across a fixed condenser 52 connected between the lead-in and ground. The tank circuit consists of the fixed condenser 52, a variable condenser 53 and a radio frequency inductance 54, connected in series. A semiconductor diode 55 is connected across the inductance coil 54 of the tank circuit to act as a high amplitude signal attenuator, as previously described. The inductance 54 is coupled to a secondary 56, which has fewer turns, and thus the two coils act as a radio frequency step-down transformer. One end of the secondary 56 is connected to the emitter of a double-base tetrode grown junction n-p-n transistor 57, and the other end of the secondary 56 is connected to ground through a bias control resistor 58, shunted by a radio frequency bypass condenser 59. An automatic volume control or bias lead 60 supplies one of the base connections of the transistor 57 with the proper bias potential, and this lead is grounded through a radio frequency bypass condenser 61. Another similar lead 62 supplies the other base connection of the transistor 57 with bias potential, and this lead is similarly grounded through a radio frequency bypass condenser 63. The source of the bias potentials supplied by these leads will be described as we come to the part of the circuit that furnishes it.

The collector of the transistor 57 is connected to the intermediate tap of a radio frequency auto transformer type primary winding 65, and this winding is connected in series with a fixed condenser 66 and a variable condenser 67 to form a tank circuit. The tank circuit is grounded at a point 68 between the two condensers. A source of collector potential is connected to one end of the auto transformer winding 65 through a fixed resistor 71 from an operating potential line 70.

A secondary winding 72 coupled to the auto transformer winding 65 provides a signal source for the frequency converter stage, which is built around a triode type grown junction n-p-n transistor 73. The secondary winding 72 is connected at one end to the base of this transistor 73 and at the opposite end through a fixed resistance 74 to the potential line 70. This same end of the secondary winding 72 is also grounded through a fixed resistance 75 shunted by a fixed radio frequency bypass condenser 76. The emitter of the transistor 73 is connected to a transistor oscillator circuit by means of a secondary winding 77, one end of which is grounded and the other end of which is connected through a fixed resistor 78 to the emitter. The resistor 78 is bypassed for radio frequencies by a fixed condenser 79.

The oscillating current supplied to the transistor 73 is supplied by an oscillator circuit built around a transistor 80. The emitter of this transistor is grounded through a fixed resistance 81, and power is supplied from the potential line 70 through a supply line 82, which connects through a fixed resistor 83 to one end of an oscillator tank circuit, and then through another fixed resistor 84 to the base of the transistor 80. The oscillator tank circuit consists of a fixed inductance 85 shunted by a variable condenser 86, which, in turn, is shunted by a trimmer condenser 87. The three variable condensers 53, 67 and 86 operate together in the usual manner.

One end of the oscillator tank circuit is connected to the collector of the transistor 80, and the other end of this tank circuit is connected to the power supply circuit between the resistors 83 and 84, and is also grounded through a fixed condenser 89. This same end of the tank circuit is also connected to one end of an oscillator pickup coil 90, the other end of which is connected through a fixed condenser 91 to the emitter. The base contact of the transistor 80 is grounded through a fixed condenser 92. The secondary winding, through which oscillations are furnished to the second transistor 73 in the main line of the circuit, is coupled to the inductance 85 of the oscillator tank circuit.

The intermediate frequency, resulting from the mixing of the output of the oscillator and the incoming radio carrier frequency, is taken from the collector of the transistor 73 to an intermediate tap of an auto transformer primary coil 93, and this coil is shunted by a condenser 94 so as to form the primary of a tuned intermediate frequency transformer. One end of the tank circuit thus formed is connected through a fixed resistor 95 to the potential line 70. This same end of the intermediate frequency transformer primary is also grounded through a fixed condenser 96. A secondary winding 97 is provided for the intermediate frequency transformer, and this winding is shunted by a condenser 98 to form a tuned secondary winding. A tertiary winding 99 is also provided, and this winding has fewer turns, so that a step-down in voltage and a step-up in current is accomplished. One end of this tertiary winding is connected to one end of the secondary winding, and supplied with power through a resistor 101 from the potential line 70. It is also connected to ground through a fixed resistor 102 shunted by a fixed condenser 103. The other end of the tertiary winding is connected to the emitter of a second double-base tetrode type grown junction n-p-n transistor 100.

The two base contacts of the second tetrode transistor 100 are connected to bias leads 60 and 62 as were the two base leads of the first tetrode transistor. The collector of the second tetrode 100 is connected to one end of a tank circuit generally designated as 105 and formed of a coil shunted by a condenser and by a fixed resistance. This tank circuit forms the primary of an intermediate frequency transformer, and the other end of this tank circuit is connected to the potential line 70 through a fixed resistor 106 and is grounded through a radio frequency bypass condenser 107.

The secondary of this intermediate frequency transformer consists of a tank circuit generally designated as 108 and comprised of a secondary coil shunted by a fixed condenser, one side of which is grounded. A tertiary coil 109 is provided, coupled to the secondary of this transformer, and one end of that tertiary coil is connected to the emitter of the next transistor 110. The other end of the tertiary coil is grounded through a fixed resistance 111, shunted by a fixed condenser 112.

The fourth transistor in the main circuit line is furnished with power through a fixed resistor 113 connected between it and the potential line 70, and is connected to ground through a fixed resistor 114 shunted by a fixed condenser 115. The output of the transistor 110 is taken from the collector and impressed upon the primary 116 of another intermediate frequency transformer. This primary consists of an inductance shunted by a fixed capacity, as before. The other end of the primary 116 is connected to potential line 70 through fixed resistor 117 and connected to ground through a radio frequency bypass condenser 118.

Passing now to FIGURE 5, we find that the potential supply line 70 and the automatic volume control or bias supply leads 60 and 62 continue on into the part of the circuit shown therein. The secondary of the intermediate frequency transformer, of which the primary 116 is a part, is shown at 120 in the upper left-hand corner of FIGURE 5, and consists of a secondary coil shunted by a fixed condenser, one side of which is grounded. A tertiary coil 121 is again provided, and one end of this tertiary coil is connected to the emitter of another n-p-n grown junction transistor 122. The other end of the tertiary coil 121 is grounded through a fixed resistor 123 shunted by a fixed condenser 124.

The base on the transistor 122 is supplied with potential through a fixed resistor 125 connected between the base and the potential supply line 70, and the base is also connected to ground through a fixed resistor 126 and through a fixed condenser 127. The output from the transistor 122 is taken from the collector and applied to the primary 130 of the final intermediate frequency transformer. That primary, like the previous transformer primary, consists of an inductance coil shunted by a fixed condenser. Potential is supplied to the collector of the transistor 122 by connecting the potential line 70 to the end of the transformer primary 130 opposite to that at which the collector is connected.

A secondary 131 is provided for the last intermediate frequency transformer, and one end of this secondary is connected to a voltage doubler circuit consisting of a semiconductor diode 132 connected between the end of the secondary winding and ground and a second semiconductor diode 133, also connected to the end of the secondary 131, but oriented in the opposite direction. The other end of this second diode 133 is connected to the primary of an audio frequency transformer 134. The other lead of the primary of this transformer is connected through a resistor 135 to the bias control line 60. A radio frequency ground is provided between the transformer primary and the resistor by a fixed condenser 136, and another fixed condenser 137 is connected between the bias control line 60 and ground on the other side of the resistor 135. A radio frequency bypass condenser 138 is also connected across the primary winding of the transformer 134. The other end of the secondary winding 131 of the last intermediate frequency transformer is connected to the bias or automatic volume control line 62 through a fixed resistor 140, and this bias control line 62 is also connected to the potential line 70 by a fixed resistor 141. By properly proportioning these resistors, the desired amount of bias is supplied back through the bias control line 62. Radio frequency bypass condensers 142 and 143 are provided between ground and a point at each end of the resistor 140.

Audio frequency currents are taken from the transformer 134 by its secondary and applied across a volume control potentiometer 145. One end of this potentiometer is grounded and the other end is connected through a fixed resistance 146 to the movable contact. The output taken from the movable contact, through a direct current isolating condenser 147, is applied to the base of a p-n-p alloyed junction transistor 150. The base of this transistor is connected to the collector through a fixed resistance 151 and the collector is grounded through a radio frequency bypass condenser 152. The collector is also connected through the primary of a second audio transformer 153 to ground.

Operating voltage is supplied for the transistor 150 from a 12-volt direct current power supply (not shown) through connecting lines 154, 155, 156 and a fixed resistor 157, leading to the emitter, and by connecting lines 154, 155, a fixed resistor 158, connecting line 159 and a fixed resistor 160, leading to the base of the transistor 150. Another fixed resistance 160*a*, connected between the base and ground, helps regulate the base voltage. Fixed condensers 161, 162 and 163 between these circuits and ground eliminate feedback and unwanted oscillations. Power is supplied to the potential line 70 through lines 154, 155, the fixed resistor 158 and line 159. Radio frequency currents are bypassed to ground from potential line 70 by a bypass condenser 164.

The secondary of the audio transformer 153 has a push-pull winding, and two p-n-p alloy junction transistors 170 and 171 are connected in push-pull fashion to it. The ends of the transformer secondary are connected to the bases of the two transistors and the emitters are connected together and through a pair of resistors 172 and 173, in series, to the center tap. Power is supplied to a point between these two resistors by continuation of the power line 154. The center tap of the transformer is grounded through another fixed resistor 175. The outputs of the two p-n-p transistors 170 and 171 are taken from the collectors and connected to opposite ends of a push-pull speaker winding 176. A fixed condenser 177 is connected across the speaker windings and a center tap on the speaker winding is connected by line 178 to ground.

It will immediately be apparent to those skilled in the art that a wide variety of values may be used for the various inductances, capacities, resistors, and the like, in this circuit, and such values as it falls within the ability of those skilled in the art to utilize are considered to be within the scope of this invention and of the appended claims.

It should be particularly noted that a resistance may be placed in series with the first diode 55, which is used in the circuit to prevent overloading, and it should also be noted that resistor 101 in the power supply line to the second tetrode transistor can be varied to effect distortion correction and that the resistor 141 between the potential line 70 and the bias voltage line 62 can be varied to adjust the automatic volume control effected by the connections from the bias voltage line 62.

An automobile radio receiver utilizing the principles of this invention has been shown to be capable of maintaining very flat, uniform output over an extremely wide range of input amplitudes, the input amplitudes ranging from ten microvolts to three volts with output changes of the order of seven decibels.

What is claimed is:

1. In a radio receiving system, a receiving antenna, a radio frequency choke connecting said antenna to ground, a fixed condenser connected between said antenna and ground, a fixed inductance and a variable condenser connected in series and across said fixed condenser to form a tuned input tank circuit, and a semiconductor diode connected across said variable condenser to attenuate high amplitude signals.

2. In a radio receiving system, a receiving antenna, a first capacitor connected between said antenna and a reference potential, an inductor and a second capacitor connected in series across said first capacitor, a semiconductor diode connected across said second capacitor to attenuate high amplitude signals, and conductive means offering low impedance to direct current shunting said first capacitor.

3. In a radio receiving system including a transistor amplifier, antenna means for developing a signal across a pair of input terminals, a first series circuit including an inductor and a capacitor connected across said input terminals, a second series circuit shunting said capacitor and including a semiconductor diode and resistance means, and means connected to said resistance means and coupled to said inductor for applying signals to the input of said transistor amplifier.

4. In a radio receiving system, an amplifier including a transistor having an input electrode, an output electrode and a common electrode, antenna means for developing a signal across a pair of input terminals, a series circuit including an inductor and a capacitor connected across said input terminals, a control voltage developing circuit shunting said capacitor and including a semiconductor diode and resistance means, means connected to said resistance means and coupled to said inductor for applying signals to said input electrode, and gain control signal developing means coupled to said common electrode whereby the effects of said control voltage and said gain control signal are cumulative over at least a portion of the input signal amplitude range.

5. In a radio receiving system, a transistor amplifier having an input circuit, a source of automatic gain control voltage connected in said input circuit, an antenna circuit including antenna means along with an inductor and a capacitor connected in a closed series circuit, a semiconductor diode connected across said inductor, and inductive means connected in said input circuit of said transistor amplifier and inductively coupled to said inductor, said input circuit being isolated from said antenna circuit for direct currents.

References Cited in the file of this patent

UNITED STATES PATENTS

| | | |
|---|---|---|
| 2,135,561 | Connell | Nov. 8, 1938 |
| 2,144,995 | Pulvari-Pulmacher | Jan. 24, 1939 |
| 2,186,291 | Griffin | Jan. 9, 1940 |
| 2,397,167 | Stodola | Mar. 26, 1946 |
| 2,434,929 | Holland et al. | Jan. 27, 1948 |
| 2,691,775 | Marcum | Oct. 12, 1954 |
| 2,773,945 | Theriault | Dec. 11, 1956 |
| 2,774,866 | Burger | Dec. 18, 1956 |
| 2,897,360 | Baugh | July 28, 1959 |
| 2,941,070 | Barry | June 14, 1960 |

FOREIGN PATENTS

| | | |
|---|---|---|
| 413,383 | Great Britain | July 10, 1934 |
| 414,187 | Great Britain | Aug. 2, 1934 |

OTHER REFERENCES

Publication: "Radio & Telev. News," April 1955, page 69.